United States Patent [19]
Watanabe et al.

[11] Patent Number: 5,602,408
[45] Date of Patent: Feb. 11, 1997

[54] SEMICONDUCTOR DEVICE HAVING POLYCRYSTALLINE SILICON LOAD DEVICES

[75] Inventors: Hitomi Watanabe; Hiroaki Takasu, both of Chiba, Japan

[73] Assignee: Seiko Instruments Inc., Japan

[21] Appl. No.: 419,356

[22] Filed: Apr. 10, 1995

[30] Foreign Application Priority Data

Apr. 25, 1994 [JP] Japan .................................. 6-086943
Feb. 15, 1995 [JP] Japan .................................. 7-027124

[51] Int. Cl.⁶ .................................................. H01L 23/62
[52] U.S. Cl. ...................... 257/350; 257/380; 257/536; 257/538
[58] Field of Search .................................. 257/355, 358, 257/359, 360, 363, 380, 379, 536, 538, 903, 904

[56] References Cited

FOREIGN PATENT DOCUMENTS

| | | | |
|---|---|---|---|
| 63-229744 | 9/1988 | Japan | 257/538 |
| 2-143452 | 5/1990 | Japan | 257/538 |
| 3-288466 | 12/1991 | Japan | 257/536 |
| 5-114714 | 5/1993 | Japan | 257/379 |

*Primary Examiner*—Minhloan Tran
*Attorney, Agent, or Firm*—Adams & Wilks

[57] ABSTRACT

A semiconductor device comprises a silicon semiconductor substrate and an insulating film formed on a surface of the silicon semiconductor substrate. One of a surface of the silicon semiconductor substrate or a surface of the insulating film is provided with at least one step portion. A polycrystalline silicon layer is formed uniformly on at least a side surface of the step portion and a top surface of the insulating film. The polycrystalline silicon layer which is formed on the side surface of the step portion comprises a resistance element, and a portion of the polycrystalline silicon layer which is formed on the top surface of the insulating film is doped with an impurity to form a conductive element. By this construction, the area occupied by the load devices on the semiconductor substrate is effectively reduced, thereby increasing the packing density of the semiconductor device.

19 Claims, 8 Drawing Sheets

SEMICONDUCTOR DEVICE HAVING POLYCRYSTALLINE SILICON LOAD DEVICES

BACKGROUND OF THE INVENTION

The present invention relates to a semiconductor device and method of fabricating it and, more particularly, to structures of load devices using polycrystalline silicon, structures of semiconductor devices utilizing load devices using polycrystalline silicon, and methods of fabricating them.

Heretofore, the following steps have been employed in order to form load devices on a semiconductor substrate using polycrystalline silicon.

Figure 9A:
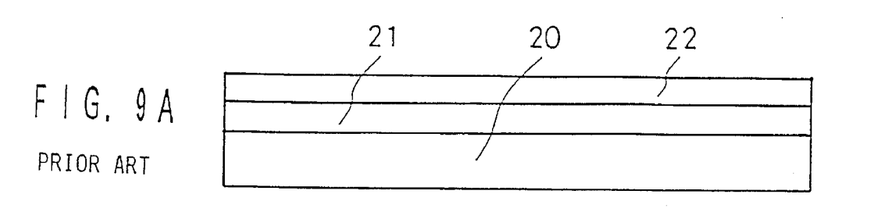
FIG. 9A to FIG. 9D are views illustrating the prior art techniques.

First, as shown in FIG. 9A, a silicon oxide film 21 that is an insulating film is formed on a silicon substrate 20 by well-known techniques, and then a polycrystalline silicon film 22 is formed by well-known techniques.

Figure 9B:
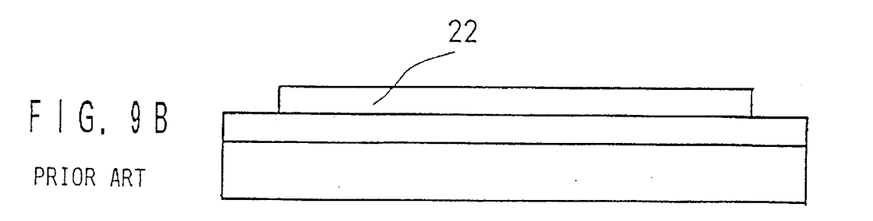

Then, as shown in FIG. 9B, the polycrystalline silicon film 22 is patterned and etched away.

Figure 9C:
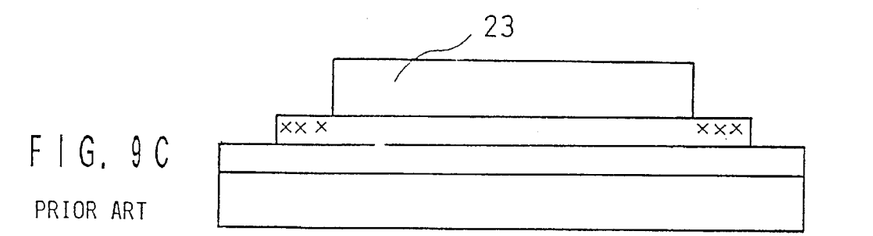

Thereafter, as shown in FIG. 9C, those portions of the polycrystalline silicon film 22 which should be maintained at high resistance as load devices are coated with a well-known masking material 23 by well-known techniques. In order to obtain low-resistivity portions which act as conductive interconnections or whose resistance is so low that an Ohmic contact can be made with other conductive interconnections, an impurity is implanted by well-known techniques.

Figure 9D:
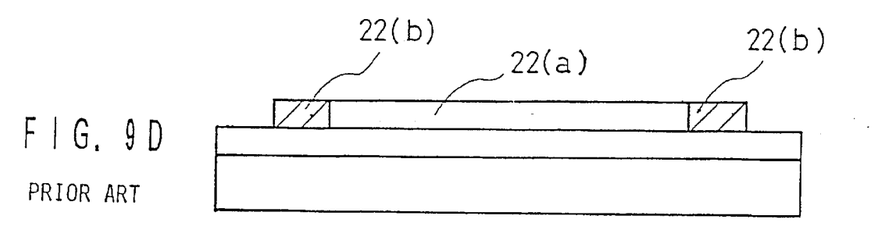

Subsequently, if the masking material 23 is removed as shown in FIG. 9D, a load device portion 22(a) of high resistivity and low-resistivity portions 22(b) are formed.

However, in the above-described prior art method, the load devices and the conductive interconnections directly connected with the load devices are all formed horizontally with respect to the semiconductor substrate and so each load device occupies a large area. Numerous manufacturing steps are needed to form the masking material film for increasing the device densities of semiconductor devices and for forming the low-resistivity portions directly connected with the load devices.

Accordingly, the present invention achieves the following objects:

(1) The area occupied by each load device is reduced to increase the device-packing densities of semiconductor devices.

(2) The area occupied by each load device is reduced to increase the device-packing densities of semiconductor devices.

Also, load on manufacturing steps for load devices is reduced.

SUMMARY OF THE INVENTION

In order to solve the foregoing problems, the present invention uses the following means during steps for forming load devices:

(1) A step for forming a polycrystalline silicon layer after forming steps on a semiconductor substrate and a step for patterning and etching away the polycrystalline silicon layer are contained. The load device consists of a series of polycrystalline silicon layers having the steps and having a uniform thickness.

(2) A step for forming a polycrystalline silicon layer after forming steps on a semiconductor substrate, a step for patterning and etching away the polycrystalline silicon layer, and a step for implanting a sufficient amount of impurity into the whole surface of the semiconductor substrate to permit the polycrystalline silicon layer to act as conductive interconnections are contained. In this way, a structure in which the load devices and the conductive interconnections directly connected with the load devices are formed by a series of polycrystalline silicon layers which have the steps and a uniform thickness. The load devices are formed by side walls of the steps. The conductive interconnections directly connected with the load devices are formed by horizontal portions of the steps.

The following operation is obtained by using the above-described structure and fabrication method.

Where the means (1) described above is used, the polycrystalline silicon layer is formed into a stepped structure. Therefore, if load devices of the same resistivity value are formed by the polycrystalline silicon layer, the area occupied by the load devices on the semiconductor substrate is smaller than the area occupied heretofore.

Where the means (2) described above is employed, step portions of the polycrystalline silicon layer are used as load devices and, therefore, the area occupied by the load devices is smaller than heretofore. Furthermore, an impurity is implanted to form conductive interconnections directly connected with the load devices without coating the load device portions with a masking material. Consequently, the load devices and the conductive interconnections directly connected with the load devices can be formed with fewer steps than heretofore.

DETAILED DESCRIPTION OF THE PREFERRED EMBODIMENTS

A first example of the present invention is hereinafter described.

Figure 1A:
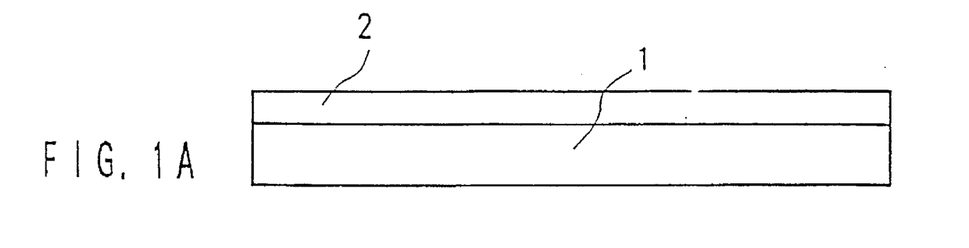
FIG. 1A to FIG. 1D are views illustrating a first example of the invention.

First, as shown in FIG. 1A, an insulating film comprised of a silicon oxide film 2 is formed to, for example, about 0.1 to 2 μm, on a silicon substrate 1 by well-known techniques. At this time, if necessary, before the formation of the silicon oxide film 2, components (e.g., a device isolating-insulating film, an impurity-diffused layer, and conductive interconnections) necessary for fabrication of a semiconductor device may be previously formed on the silicon substrate 1.

Figure 1B:
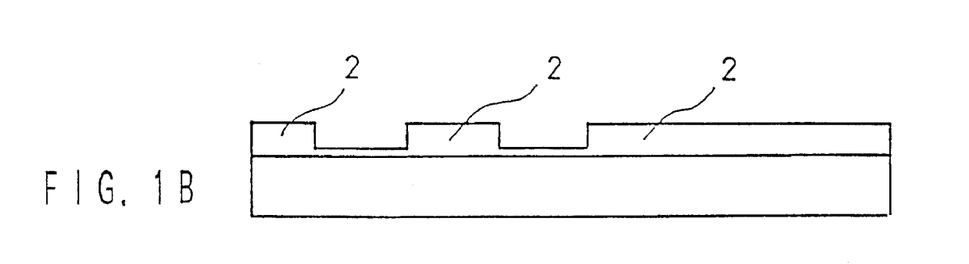

Then, as shown in FIG. 1B, the silicon oxide film 2 is patterned and etched away to form steps on the silicon substrate. At this time, the etching of the silicon oxide film 2 is stopped before reaching the surface of the silicon substrate 1 or the insulating film is formed to such extent that step portions are not fully buried in the insulating film after the etching reaches the surface of the silicon substrate 1. In this way, the insulation of a polycrystalline silicon layer 3, which will be formed as described later, from the silicon substrate 1 or from the previously formed components is maintained. Alternatively, etching is performed up to the surface of the silicon surface 1, and the silicon substrate 1 or the previously formed components are brought into contact with the polycrystalline silicon layer 3 formed as described later.

Figure 1C:
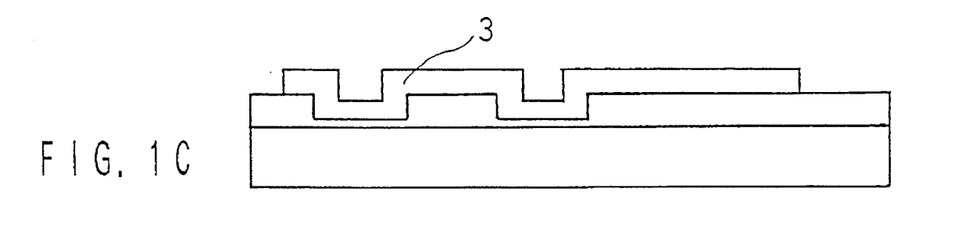

Then, as shown in FIG. 1C, the polycrystalline silicon layer 3 is formed up to approximately 0.05 to 1 μm by well-known techniques. Subsequently, the polycrystalline silicon layer 3 is patterned and etched away. If necessary, an impurity such as phosphorus or arsenic may be introduced, for example by ion implantation, for example, at about $0/cm^2$ to $1E15/cm^2$ to obtain a desired resistance value.

Figure 1D:
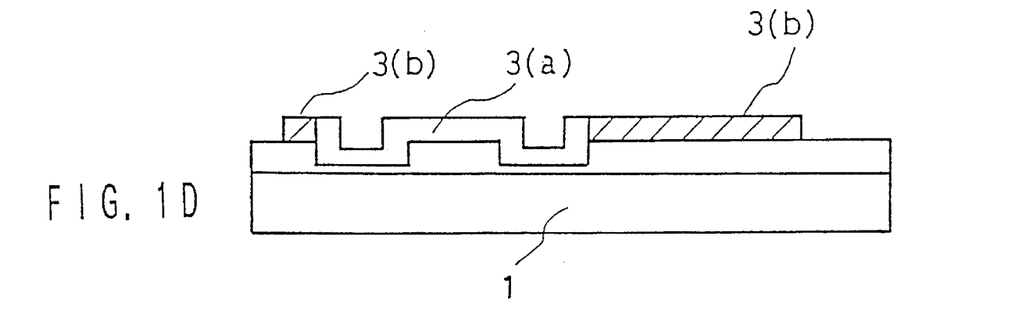

Thereafter, as shown in FIG. 1D, those portions of the polycrystalline silicon layer which should be maintained at high resistance as load devices are coated with a well-known masking material by well-known techniques. In order to obtain low-resistivity portions which act as conductive interconnections or whose resistance is so low that an Ohmic contact can be made with other conductive interconnections, an impurity such as phosphorus or arsenic is implanted by well-known techniques. The masking material is removed. As a result, a high-resistivity load device portion $3(a)$ and low-resistivity portions $3(b)$ are formed.

Since the load device formed in this way has steps, the stress or the like in the polycrystalline silicon changes. The sheet resistance (resistance value per unit area) is somewhat higher than the sheet resistance of the load device fabricated by the prior art techniques under the same conditions. Therefore, where a load device of the same resistance value as the load device formed by the prior art techniques is formed according to the present example, the area occupied by the load device on the semiconductor substrate is reduced. In addition, the area substantially occupied by the load device itself is diminished.

In the above-described first example, it is obvious that introduction of the impurity into the polycrystalline silicon layer 3 may be carried out immediately after formation of the polycrystalline silicon layer 3.

A second example of the present invention is hereinafter described.

Figure 2A:
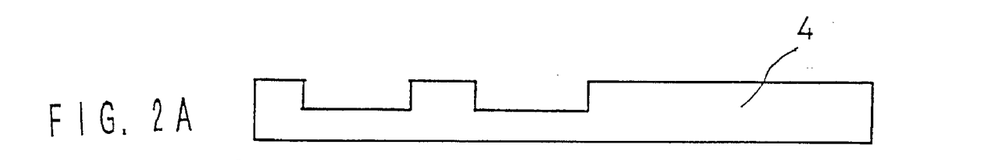
FIG. 2A to FIG. 2C are views illustrating a second example of the invention.

First, as shown in FIG. 2A, a silicon substrate 4 is patterned and etched away to form steps of about 0.1 to 2 μm on the silicon substrate 4.

Figure 2B:
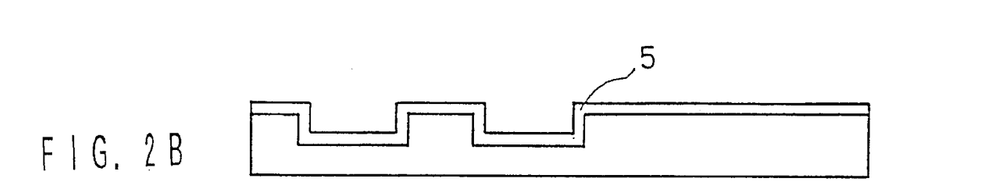

Then, as shown in FIG. 2B, a silicon oxide film 5 is formed on the silicon substrate 4 to 0.005 to 1 μm by well-known techniques in such a way that the steps are not fully buried. At this time, if necessary, before the formation of the silicon oxide film 5, components (e.g., a device isolating-insulating film, an impurity-diffused layer, and conductive interconnections) necessary for fabrication of a semiconductor device may be previously formed on the silicon substrate 4. Furthermore, if necessary, after formation of the silicon oxide film 5, parts of the silicon oxide film 5 are selectively etched away by well-known techniques, and the silicon substrate 4 or the previously formed components are brought into contact with a polycrystalline silicon layer formed as described later.

Figure 2C:
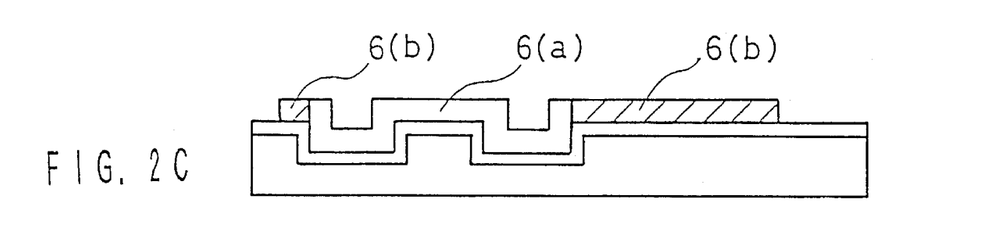

Subsequently, in the same way as in the first example, the polycrystalline silicon layer is formed up to approximately 0.05 to 1 μm by well-known techniques. Subsequently, the polycrystalline silicon layer is patterned and etched away. If necessary, an impurity such as phosphorus or arsenic may be introduced, for example by ion implantation, for example, at about $0/cm^2$ to $1E15/cm^2$ to obtain a desired resistance value. Those portions of the polycrystalline silicon layer which should be maintained at high resistance as load devices are coated with a well-known masking material by well-known techniques. In order to obtain low-resistivity portions which act as conductive interconnections or whose resistance is so low that an Ohmic contact can be made with other conductive interconnections, an impurity such as phosphorus or arsenic is implanted by well-known techniques. The masking material is removed. As a result, a high-resistivity load device portion $6(a)$ and low-resistivity portions $6(b)$ are formed out of the polycrystalline silicon layer.

Since the load device formed in this way has steps, the stress or the like in the polycrystalline silicon varies. The sheet resistance (resistance value per unit area) is somewhat higher than the sheet resistance of the load device fabricated by the prior art techniques under the same conditions. Therefore, where a load device of the same resistance value as the load device formed by the prior art techniques is formed according to the present example, the area occupied by the load device on the semiconductor substrate is reduced. In addition, the area occupied by the load device itself is diminished.

In the above-described second example, it is obvious that introduction of the impurity into the polycrystalline silicon layer may be carried out immediately after formation of the polycrystalline silicon layer.

A third example of the present invention is hereinafter described.

Figure 3A:
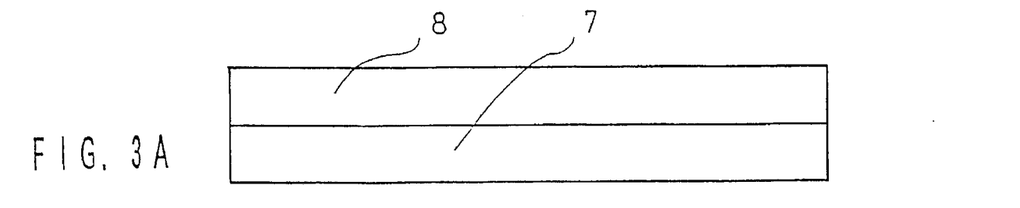
FIG. 3A to FIG. 3D are views illustrating a third example of the invention.

First, as shown in FIG. 3A, a silicon oxide film 8 is formed on a silicon substrate 7 by well-known techniques, for example to about 0.1 to 2 μm. At this time, if necessary, before the formation of the silicon oxide film 8, components (e.g., a device isolating-insulating film, an impurity-diffused layer, and conductive interconnections) necessary for fabrication of a semiconductor device may be previously formed on the silicon substrate 7.

Figure 3B:
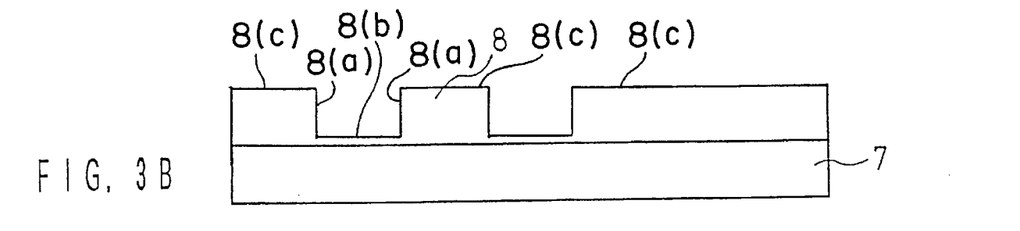

Then, as shown in FIG. 3B, the silicon oxide film 8 is patterned and etched away to form trenches defining steps on the silicon substrate. Each trench has side surfaces 8a and a base surface 8b. Each side surface 8a and an adjacent top surface 8c of the silicon oxide film 8 defines one of the steps. At this time, the etching of the silicon oxide film 8 is stopped before reaching the surface of the silicon substrate 7 or the insulating film is formed to such extent that step portions are not fully buried in the insulating film after the etching reaches the surface of the silicon substrate 7. In this way, the insulation of a polycrystalline silicon layer 9, which will be formed as described later, from the silicon substrate 7 or from the previously formed components is maintained. Alternatively, etching of the silicon oxide film 8 is performed up to the surface of the silicon surface 7, and the silicon substrate 7 or the previously formed components are brought into contact with the polycrystalline silicon layer 9 formed as described later.

Figures 3C, 3D:
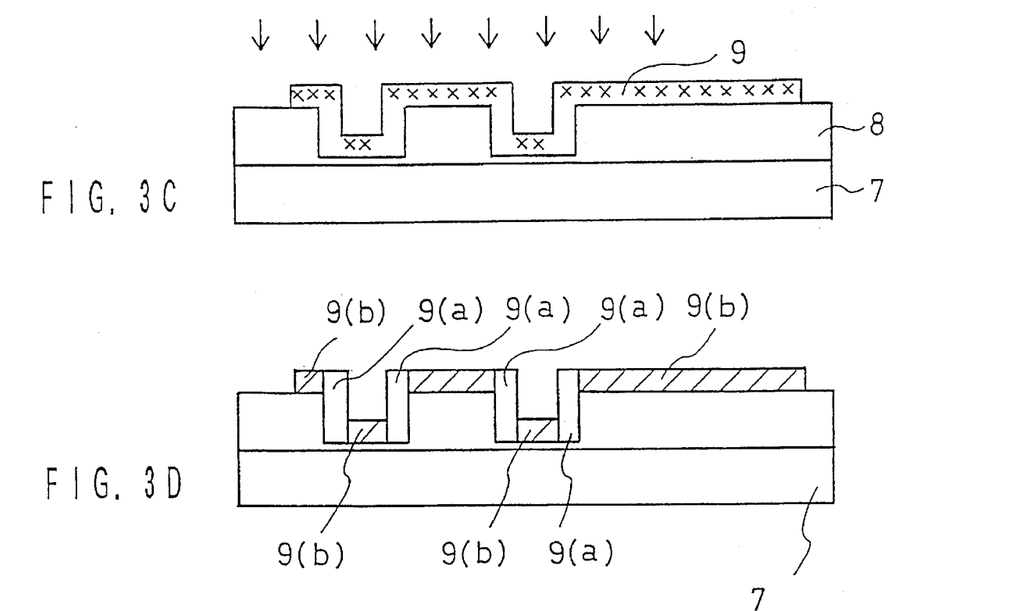

Then, as shown in FIG. 3C, the polycrystalline silicon layer 9 is formed up to approximately 0.05 to 1 μm by well-known techniques. Subsequently, the polycrystalline silicon layer 9 is patterned and etched away. A sufficient amount of impurity is introduced into the whole surface of the silicon substrate 7, for example, by ion implantation to permit the polycrystalline silicon layer 9 to act as conductive interconnections. Phosphorus is implanted at about 30 KeV at about 1E15 to 1E17/cm². Alternatively, arsenic is implanted at about 60 KeV at about 1E15 to 1E17/cm². If necessary, a further step may be performed. In this step, an impurity such as phosphorus or arsenic is introduced, for example, by ion implantation, at a sufficiently high energy at about 0/cm² to 1E15/cm² so that the impurity may be sufficiently implanted into the polycrystalline silicon layer in the side wall portions of the steps, whereby the polycrystalline silicon layer 9 has a desired resistance value.

Then, as shown in FIG. 3D, thermal processing in the subsequent step is suppressed to thereby suppress diffusion of the implanted impurity. High-resistivity load device portions 9(a) are left on the side wall portions of the polycrystalline silicon layer 9 having steep steps. Horizontal portions having no steps are sufficiently diffused with the impurity. In this manner, low-resistivity conductive interconnect portions 9(b) are formed. The suppression of the thermal processing performed in the subsequent step can be effectively carried out by using a lamp annealer instead of a thermal oxidation furnace conventionally frequently used and performing a high-temperature process in a short time.

In the above-described third example, it is obvious that introduction of the impurity into the polycrystalline silicon layer 9 may be carried out immediately after formation of the polycrystalline silicon layer 9.

A fourth example of the present invention is hereinafter described.

Figure 4A:
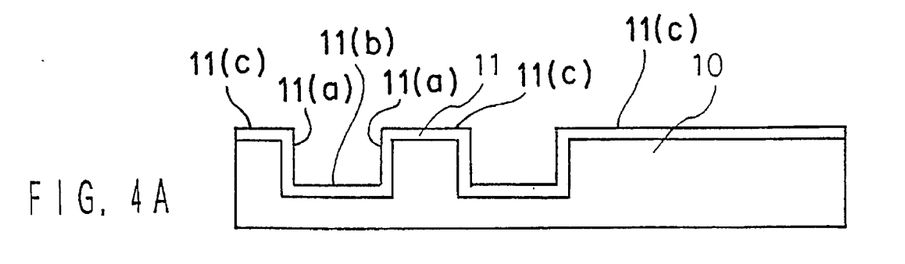
FIG. 4A and FIG. 4B are views illustrating a fourth example of the invention.

First, as shown in FIG. 4A, a silicon substrate 10 is patterned and etched away to form trenches defining steps on the silicon substrate. Each trench has side surfaces 11a and a base surface 11b. Each side surface 11a and an adjacent top surface 11c of the silicon oxide film 11 defines one of the steps. The size of the steps formed on the silicon substrate 10 is about 0.1 to 2 μm are. A silicon oxide film 11 is formed on the silicon substrate 10 to about 0.005 to 1 μm by well-known techniques in such a way that the steps are not fully buried. At this time, if necessary, before the formation of the silicon oxide film 11, components (e.g., a device isolating-insulating film, an impurity-diffused layer, and conductive interconnections) necessary for fabrication of a semiconductor device may be previously formed on the silicon substrate 10. Furthermore, if necessary, after formation of the silicon oxide film 11, parts of the silicon oxide film are selectively etched away by well-known techniques, and the silicon substrate 10 or the previously formed components are brought into contact with the polycrystalline silicon layer formed as described later.

Figure 4B:
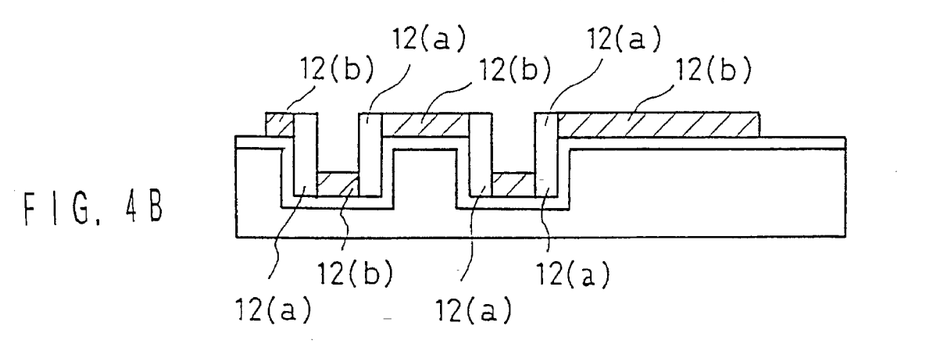

Subsequently, in the same way as in the third example, the polycrystalline silicon layer is formed up to approximately 0.05 to 1 μm by well-known techniques. Then, the polycrystalline silicon layer is patterned and etched away. A sufficient amount of impurity is introduced into the whole surface of the semiconductor substrate, for example, by ion implantation to permit the polycrystalline silicon layer to act as low-resistivity, conductive interconnections. Phosphorus is implanted at about 30 KeV at about 1E15 to 1E17/cm². Alternatively, arsenic is implanted at about 60 KeV at about 1E15 to 1E17/cm². If necessary, a further step may be performed. In this step, an impurity such as phosphorus or arsenic is introduced, for example, by ion implantation, at such a high energy at about 0/cm² to 1E15/cm² that the impurity may be sufficiently implanted into the polycrystalline silicon layer in the side wall portions of the steps, whereby the polycrystalline silicon layer has a desired resistance value.

Then, thermal processing in the subsequent step is suppressed to thereby suppress diffusion of the implanted impurity. High-resistivity load device portions 12(a) are left on the side wall portions of the polycrystalline silicon layer having steep steps. Horizontal portions having no steps are sufficiently diffused with the impurity. In this manner, low-resistivity, conductive interconnect portions 12(b) are formed. The suppression of the thermal processing performed in the subsequent step can be effectively carried out by using a lamp annealer instead of a thermal oxidation furnace conventionally frequently used and performing a high-temperature process in a short time.

In the above-described fourth example, it is obvious that introduction of the impurity into the polycrystalline silicon layer may be carried out immediately after formation of the polycrystalline silicon layer.

A fifth example of the present invention is hereinafter described.

Figure 6:
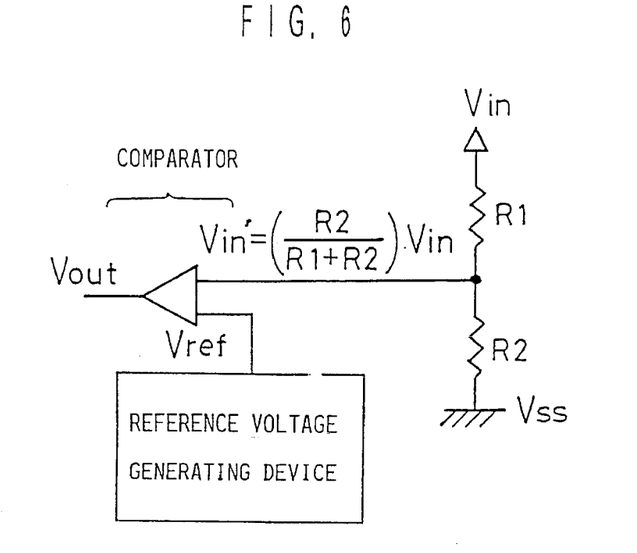
FIG. 6 is a circuit diagram of a voltage detection apparatus in a fifth example of the invention.

A voltage detection apparatus includes a reference voltage Vref-generating device, a comparator, and a load device as its components, and is formed on a semiconductor substrate. As shown in FIG. 6, the fundamental circuit configuration of the voltage detection apparatus is such that an initial input voltage Vin is divided into values determined by the resistance ratio of a load device portion R1 to a load device portion R2. The voltage Vin is supplied as a voltage Vin' to the comparator. To improve the performance, the following requirements are imposed:

(1) Electrical currents flowing through Vin supply terminal and Vss supply terminal account for most of the electrical current consumed by the voltage detection apparatus. To reduce the electrical current consumed, R1 and R2 are required to have high resistances.

(2) Where polycrystalline silicon is used as R1 and R2, if the polycrystalline silicon has a lower sheet resistance, the resistance of the polycrystalline silicon varies to a lesser extent with varying temperature. In order to enhance the performance of the apparatus, it is necessary that the silicon have a low sheet resistance.

In order to satisfy (1) and (2) in this way, the polycrystalline silicon having a low sheet resistance value is required to be made long, so that a high-resistivity body is formed. If the silicon pieces are short, such silicon pieces must be connected in series in large quantities. Where the silicon is formed on a semiconductor substrate, the area of the load device occupied by the polycrystalline silicon forms a major part of the area occupied by the voltage detection apparatus.

Accordingly, where R1 and R2 are formed, the performance of the voltage detection apparatus is enhanced by using the first example described above and, at the same time, the voltage detection apparatus and the semiconductor device containing the voltage apparatus can be miniaturized and their device densities can be enhanced.

Figure 7:
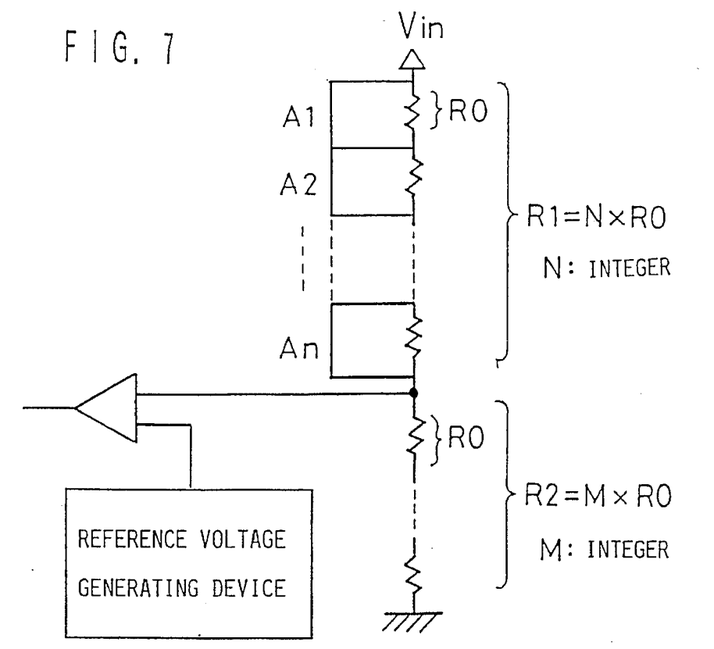
FIG. 7 is a circuit diagram of a voltage detection apparatus in the fifth example of the invention.

The detection voltage is determined by the ratio of R1 to R2. To permit the detection voltage value to vary, at least one of the R1 and R2 may take the form of a variable resistor. For example, to permit the resistance to vary during the fabrication, if a large number of small load elements connected in series are formed by aluminum interconnections as shown in the circuit diagram of FIG. 7, the resistance value can be made variable by trimming aluminum interconnections A1-An. Accordingly, in order to have numerous detection voltage values and to enhance the accuracy of the detection voltage values, a number of small load elements are required. As described above, when small load elements forming R1 and R2 are formed, the performance of the voltage detection apparatus is enhanced by using the first example described above. At the same time, the voltage detection apparatus and the semiconductor device containing the voltage apparatus can be miniaturized and their device densities can be enhanced.

Where R1 and R2 are formed out of load elements as described above, the structure is made to have an integral multiple of load elements R0 having the same resistance value as shown in the circuit diagram of FIG. 7. Furthermore, polycrystalline silicon of every R0 structure is made equal in width, length, and even the number of steps. At least in a region where R0's are formed, the top layer and the bottom layer are made to have the same structure. The load elements and surrounding environments are made uniform. These lead to uniformity of the resistance value of every R0. This is effective in improving the accuracy of the detection voltage value.

The above-described fifth example is an application of the first example to the voltage detection apparatus. In the fifth example, a voltage detection apparatus and a semiconductor device containing a voltage detection apparatus are improved in performance by using the second example for the structure and fabrication method for high-resistivity load devices or elements. Obviously, the device-packing densities can be easily enhanced.

A sixth example of the present invention is hereinafter described.

Figure 5A:
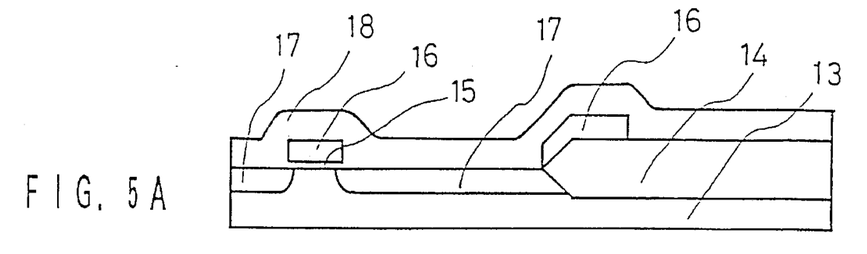
FIG. 5A to FIG. 5E are views illustrating a sixth example of the invention.

First, as shown in FIG. 5A, if necessary, a device-isolating insulating film 14, a gate-insulating film 15, a lower metallization layer 16, and an impurity-diffused layer 17 are formed on a silicon substrate 13 by well-known techniques. A silicon oxide film 18 is formed to, for example, about 0.1 to 2 μm by well-known techniques.

Figure 5B:
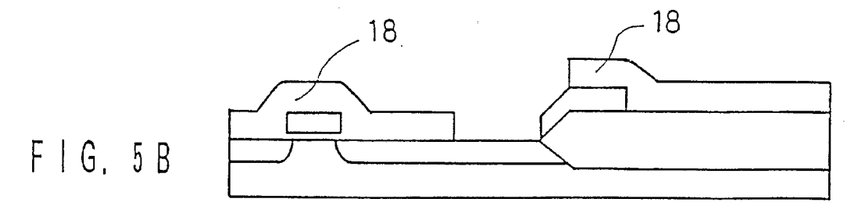

Then, as shown in FIG. 5B, the silicon oxide film 18 is patterned and etched away. Steps are formed out of the insulating film. If necessary, contact holes for interconnecting the lower metallization layer 16, the impurity-diffused layer 17, and a polycrystalline silicon layer 19 (described later) are formed.

Figure 5C:
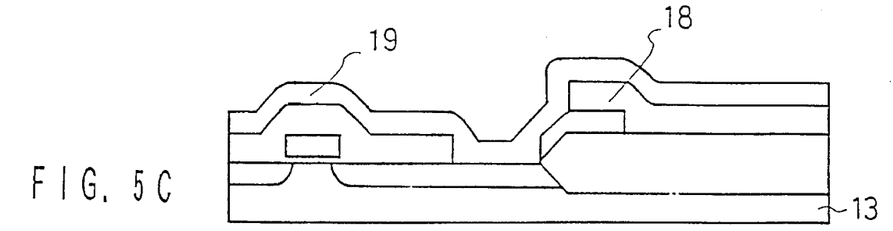
Figure 5D:
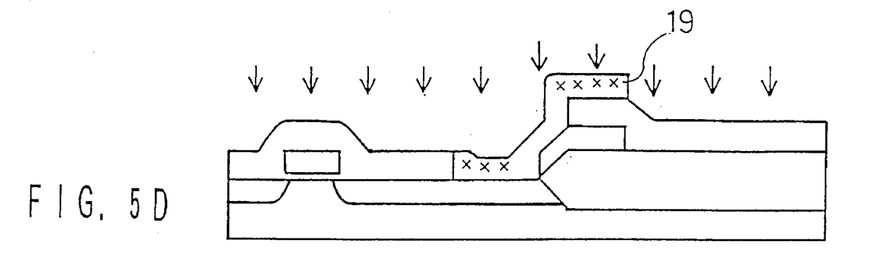

Then, as shown in FIG. 5C, the polycrystalline silicon layer 19 is formed up to approximately 0.05 to 1 μm by well-known techniques. Then, as shown in FIG. 5D, the polycrystalline silicon layer 19 is patterned and etched away. A sufficient amount of impurity is introduced into the whole surface of the silicon substrate 13, for example, by ion implantation to permit the polycrystalline silicon layer to act as a low-resistivity body capable of forming conductive interconnections. Phosphorus is implanted at about 30 KeV at about 1E15 to 1E17/cm$^2$. Alternatively, arsenic is implanted at about 60 KeV at about 1E15 to 1E17/cm$^2$. If necessary, a further step may be performed. In this step, an impurity such as phosphorus or arsenic is introduced, for example, by ion implantation, at a sufficiently high energy at about 0/cm$^2$ to 1E15/cm$^2$ so that the impurity may be sufficiently implanted into the polycrystalline silicon layer in the side wall portions of the steps, whereby the polycrystalline silicon layer has a desired resistance value.

Figure 5E:
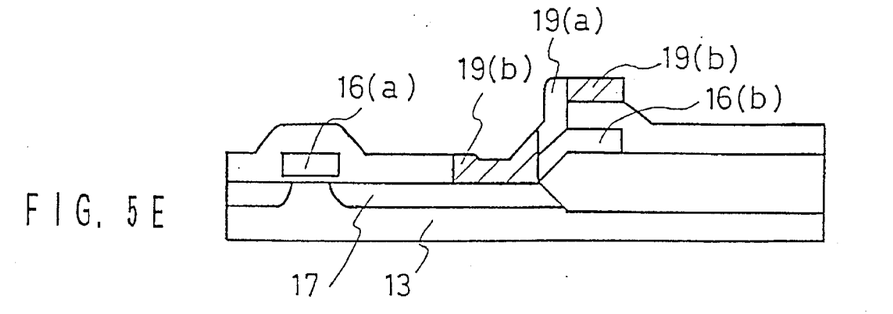

Then, as shown in FIG. 5E, thermal processing in the subsequent step is suppressed to thereby suppress diffusion of the implanted impurity. High-resistivity load device portions 19(a) are left on the side wall portions of the polycrystalline silicon layer 19 having steep steps. Horizontal portions having no steps are sufficiently diffused with the impurity. In this manner, low-resistivity conductive interconnect portions 19(b) are formed. The suppression of the thermal processing performed in the subsequent step can be effectively carried out by using a lamp annealer instead of a thermal oxidation furnace conventionally frequently used and performing a high-temperature process in a short time.

Figure 8:
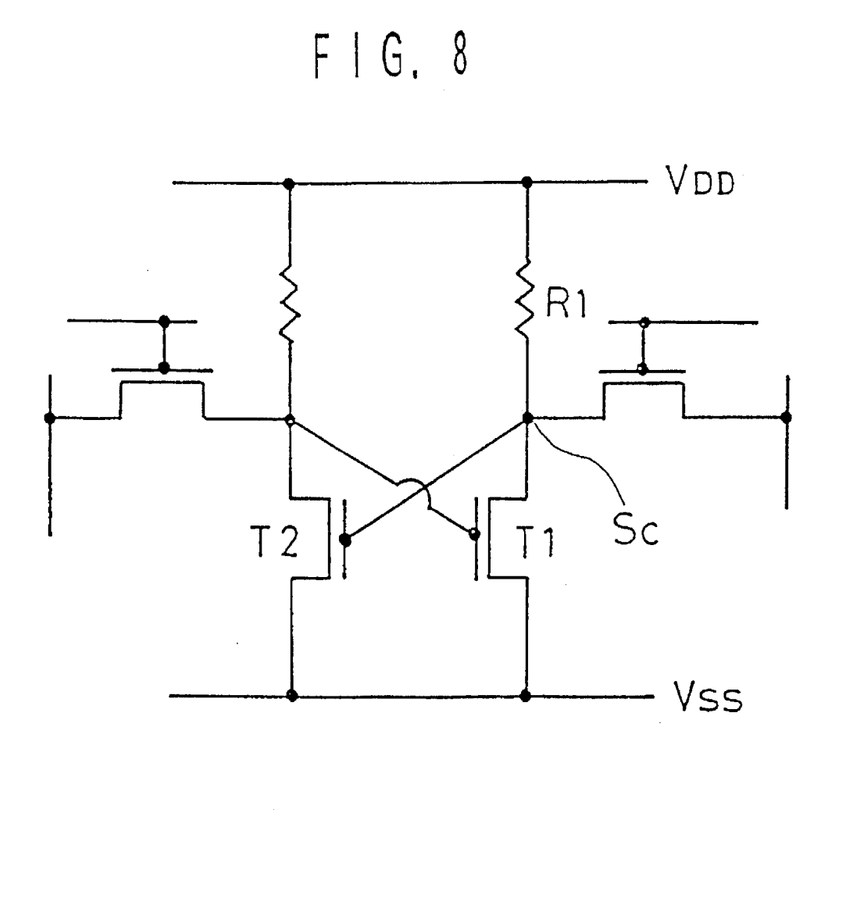
FIG. 8 is a circuit diagram of SRAM cells in a sixth example of the invention.

The above-described method is applied to a low-resistivity load-type SRAM (static random access memory). The structure shown in FIG. 5E is the structure of junction point Sc in the circuit diagram of SRAM cells shown in FIG. 8. In particular, a lower metallization layer 16(a) shown in FIG. 5E corresponds to gate electrodes of driving transistors T1 shown in FIG. 8. A lower metallization layer 16(b) corresponds to the gate electrodes of the driving transistors T2 shown in FIG. 8 or to conductive interconnections connected with the gate electrodes. An impurity-diffused layer 17 corresponds to the drains of the driving transistors T1 shown in FIG. 8. High-resistivity portions of polycrystalline silicon 19(a) corresponds to high-resistivity load elements R1 shown in FIG. 8. Low-resistivity portions 19(b) correspond to conductive interconnections connected with the Vdd line shown in FIG. 8.

In the SRAM cells having the structure described above, the load devices occupy less area on the surface of the semiconductor substrate and so semiconductor devices containing SRAMs and SRAMs can be easily packed at higher densities. Furthermore, low-resistivity portions capable of forming conductive interconnections directly connected with load devices can be formed without masking the load device portions with a masking material. Hence, load devices and conductive interconnections directly connected with the load devices can be fabricated with fewer manufacturing steps than heretofore.

In the above-described sixth example, it is obvious that introduction of the impurity into the polycrystalline silicon layer 19 may be carried out immediately after formation of the polycrystalline silicon layer 19.

The above-described sixth example is an application of the third example to SRAM cells. In the sixth example, device-packing densities of SRAMs and semiconductor devices containing SRAMs can be enhanced and load on the manufacturing steps can be reduced also by using the fourth example in the structures of high-resistivity load devices and in the fabrication method. The area occupied by each load device on a semiconductor substrate can be decreased also by using the first or second example. In consequence, the device-packing densities of SRAMs and semiconductor devices containing SRAMs can be enhanced more easily.

Where load devices and semiconductor devices including load devices are formed by a method according to the present invention, the following advantages can be obtained.

(1) The area occupied by each load device on a semiconductor substrate can be made smaller than heretofore, by using the first, second, or fifth example. Also, device-packing densities of semiconductor devices including the load devices can be enhanced.

(2) The area occupied by each load device on a semiconductor substrate can be made smaller than heretofore, by using the third, fourth, or sixth example. Also, the device-packing packing densities of semiconductor devices including the load devices can be enhanced. Furthermore, the load on the manufacturing steps can be decreased. Hence, the manufacturing cost can be curtailed.

What is claimed is:

1. A semiconductor device comprising: a silicon semiconductor substrate having a step portion formed on a surface thereof; an insulating film formed at least on the step portion of the silicon semiconductor substrate; and a polycrystalline silicon layer formed uniformly on at least a side surface of the step portion of the silicon semiconductor substrate and a top surface of the insulating film, the polycrystalline silicon layer formed on the side surface of the step portion comprising a resistance element, and a portion of the polycrystalline silicon layer formed on the top surface of the insulating film being doped with an impurity to form a conductive element.

2. A semiconductor device according to claim 1; wherein the conductive element is directly connected to the resistance element.

3. A semiconductor device according to claim 1; wherein the resistance element is doped with an impurity selected from the group consisting of phosphorus and arsenic.

4. A semiconductor device according to claim 1; wherein the insulating film is comprised of silicon oxide.

5. A semiconductor device according to claim 1; wherein the step portion of the silicon semiconductor substrate has a trench formed on the surface thereof.

6. A semiconductor device comprising: a silicon semiconductor substrate; an insulating film formed on a surface of the silicon semiconductor substrate and having a step portion; and a polycrystalline silicon layer formed uniformly on at least a side surface of the step portion of the insulating film and a top surface of the insulating film, the polycrystalline silicon layer formed on the side surface of the step portion comprising a resistance element, and a portion of the polycrystalline silicon layer formed on the top surface of the insulating film being doped with an impurity to form a conductive element.

7. A semiconductor device according to claim 6; further comprising a conductive layer disposed between the insulating film and the silicon semiconductor substrate, and a contact hole formed in the insulating film for electrically connecting the resistance element to the conductive layer.

8. A semiconductor device according to claim 6; wherein the conductive element is directly connected to the resistance element.

9. A semiconductor device according to claim 6; wherein the resistance element is doped with an impurity selected from the group consisting of phosphorus and arsenic.

10. A semiconductor device according to claim 6; wherein the insulating film is comprised of silicon oxide.

11. A semiconductor device according to claim 6; wherein the step portion of the insulating film has a trench formed on a surface thereof.

12. A semiconductor device comprising: a silicon semiconductor substrate having a main surface and at least one trench formed in the main surface, the trench having a pair of side surfaces and a base surface; an insulating film formed in the trench of the silicon semiconductor substrate and at least on a portion of the main surface of the silicon semiconductor substrate outside of the trench; and a polycrystalline silicon layer formed uniformly on at least the side and base surfaces of the trench of the silicon semiconductor substrate and the portion of the insulating film outside of the trench, the polycrystalline silicon layer formed on the side surfaces of the trench comprising resistance elements, and a portion of the polycrystalline silicon layer formed on the base surface of the trench and the portion of the insulating film outside of the trench being doped with an impurity to form conductive elements.

13. A semiconductor device according to claim 12; wherein each conductive element is directly connected to one of the resistance elements.

14. A semiconductor device according to claim 12; wherein the resistance elements are doped with an impurity selected from the group consisting of phosphorus and arsenic.

15. A semiconductor device according to claim 12; wherein the insulating film is comprised of silicon oxide.

16. A semiconductor device comprising: a silicon semiconductor substrate having a main surface; an insulating film formed on the main surface of the silicon semiconductor substrate and having at least one trench formed in a surface thereof, the trench having a pair of side surfaces and a base surface; and a polycrystalline silicon layer formed uniformly on at least the side and base surfaces of the trench of the insulating film and a surface of the insulating film outside of the trench, the polycrystalline silicon layer formed on the side surfaces of the trench comprising resistance elements, and a portion of the polycrystalline silicon layer formed on the base surface of the trench and the surface of the insulating film outside of the trench being doped with an impurity to form conductive elements.

17. A semiconductor device according to claim 16; wherein the conductive elements are directly connected to the insulating film.

18. A semiconductor device according to claim 16; wherein the resistance elements are doped with an impurity selected from the group consisting of phosphorus and arsenic.

19. A semiconductor device according to claim 16; wherein the insulating film comprises a silicon oxide film.

* * * * *